United States Patent
Beumer

(10) Patent No.: US 6,744,308 B1
(45) Date of Patent: Jun. 1, 2004

(54) SYSTEM AND METHOD FOR ESTABLISHING THE INPUT IMPEDANCE OF AN AMPLIFIER IN A STACKED CONFIGURATION

(75) Inventor: Kim E. Beumer, Richardson, TX (US)

(73) Assignee: Microtune (Texas), L.P., Plano, TX (US)

( * ) Notice: Subject to any disclaimer, the term of this patent is extended or adjusted under 35 U.S.C. 154(b) by 0 days.

(21) Appl. No.: 10/232,348

(22) Filed: Aug. 30, 2002

(51) Int. Cl.[7] .................................................. G06G 7/26

(52) U.S. Cl. ..................... 327/563; 330/254; 330/260; 327/67

(58) Field of Search ................................ 327/65–67, 89, 327/345, 359, 563; 330/254, 260

(56) References Cited

U.S. PATENT DOCUMENTS

| | | | |
|---|---|---|---|
| 6,255,889 B1 | * | 7/2001 | Branson ....................... 327/359 |
| 6,404,263 B1 | * | 6/2002 | Wang .......................... 327/359 |
| 6,438,365 B1 | * | 8/2002 | Balteanu ...................... 455/326 |

* cited by examiner

*Primary Examiner*—Kenneth Wells
(74) *Attorney, Agent, or Firm*—Baker Botts L.L.P.

(57) ABSTRACT

A circuit for establishing the input impedance of an amplifier includes an amplifier, a circuit component, a first feedback resistor, and a second feedback resistor. The amplifier has an input impedance and is coupled to a load having a load impedance. The circuit component is coupled to the load and shares at least a portion of a bias current with the amplifier. The first feedback resistor is coupled the amplifier and the load, and has a first impedance. The second feedback resistor is coupled to the amplifier and has a second impedance. The input impedance of the amplifier is established based at least in part upon the first impedance and the second impedance.

26 Claims, 3 Drawing Sheets

SYSTEM AND METHOD FOR ESTABLISHING THE INPUT IMPEDANCE OF AN AMPLIFIER IN A STACKED CONFIGURATION

TECHNICAL FIELD OF THE INVENTION

This invention relates to circuits and more particularly to a system for establishing the input impedance of an amplifier in a stacked configuration.

BACKGROUND OF THE INVENTION

Prior attempts to match the input impedance of an amplifier to the impedance associated with a load, such as a load resistor, include adding a resistor to the amplifier in either shunt or series configuration. A drawback to this approach is that it adds a 3 dB noise figure in the circuit. A further drawback to this approach is that it is difficult to always set the input impedance of the amplifier and the gain of amplifier independently of each other.

Prior attempts to stack a mixer and an amplifier so that they could share a bias current involved the use of a current source in the circuit. A drawback to this approach is that the voltage used to operate the transistor associated with the current source consumes a valuable portion (e.g., 1.0 to 1.5 volts) of the overall voltage headroom available in the circuit.

SUMMARY OF THE INVENTION

In accordance with the present invention, the disadvantages and problems associated with prior circuits have been substantially reduced or eliminated.

In one embodiment, a circuit for establishing the input impedance of an amplifier includes an amplifier, a circuit component, a first feedback resistor, and a second feedback resistor. The amplifier has an input impedance and is coupled to a load having a load impedance. The circuit component is coupled to the load and shares at least a portion of a bias current with the amplifier. The first feedback resistor is coupled to the amplifier and the load, and has a first impedance. The second feedback resistor is coupled to the amplifier and has a second impedance. The input impedance of the amplifier is established based at least in part upon the first impedance and the second impedance.

In another embodiment, a circuit for establishing a bias current includes a mixer, an amplifier, a bias resistor, a comparator, and a drive circuit. The mixer receives a drive voltage and at least a portion of a bias current. The amplifier is coupled to the mixer and receives at least a portion of the bias current. A bias resistor is coupled to the amplifier at a node and a bias voltage exists at the node. The comparator is coupled to the node and compares the bias voltage with a reference voltage. The comparator further generates an output signal based at least in part upon the comparison. The drive circuit generates the drive voltage in response to the output signal such that the bias voltage substantially equals the reference voltage thereby establishing the bias current.

The following technical advantages may be achieved by some, none, or all of the embodiments of the present invention. Technical advantages of the circuits include the ability to match the input impedance of an amplifier with the impedance of a load using feedback resistors. A further advantage is that one feedback resistor may be used to set the gain of the amplifier and the other may essentially set the input impedance of the amplifier. Other advantages of the circuits include a feedback loop comprising a comparator and a drive circuit that may be used to establish a bias current without the use of a separate current source. In this regard, the voltage headroom of the separate current source is saved. These and other advantages, features, and objects of the present invention will be more readily understood in view of the following detailed description and the drawings.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF EXAMPLE EMBODIMENTS OF THE INVENTION

Figure 1:
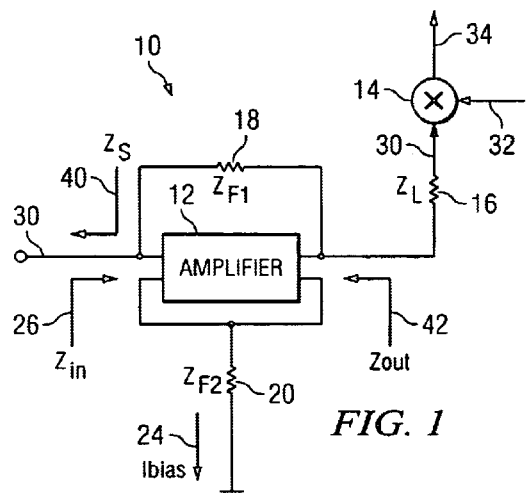
FIG. 1 illustrates one embodiment of a circuit for establishing the input impedance of an amplifier.

FIG. 1 illustrates one embodiment of a circuit 10 that includes an amplifier 12 coupled to a mixer 14 by a load resistor 16. Amplifier 12 is further coupled to a first feedback resistor 18 and a second feedback resistor 20. In general, mixer 14 is arranged in a stacked configuration with amplifier 12 such that they may share a bias current 24. In this stacked configuration, the second feedback resistor 20 may be selected to establish a desired gain for amplifier 12. First feedback resistor 18 may then be set such that feedback resistors 18 and 20 together establish an appropriate input impedance 26 for amplifier 12.

Although the following description of FIG. 1 is detailed with respect to a mixer 14 coupled to amplifier 12 in a stacked configuration, it should be understood that any suitable circuit component may be arranged in a stacked configuration in order to share bias current 24. For example, a second amplifier may be arranged in a stacked configuration with amplifier 12 in order to share at least a potion of bias current 24.

Amplifier 12 comprises any suitable number and combination of amplifiers, such as, for example, a variable gain amplifier or a variable gain attenuator in series with a fixed gain amplifier. In one embodiment, amplifier 12 forms a portion of a broadband integrated television tuner that receives a radio frequency (RF) signal 30 that spans the television frequency band. In this embodiment, amplifier 12 may comprise a low noise amplifier (LNA) with a high linearity that is sufficient to pass the entire television band. Amplifier 12 functions to control high input signal levels in the received RF signal 30. Amplifier 12 is capable of receiving signals from a variety of sources, such as an antenna or a cable television line. Amplifier 12 regulates the varying signal levels in this broadband of received channels.

Amplifier 12 is characterized by an input impedance 26. Prior attempts to match the input impedance 26 of amplifier 12 to the impedance associated with load resistor 16, $Z_L$, include adding a resistor to amplifier 12 in either shunt or series configuration A drawback to this approach is that it adds a 3 dB noise figure in circuit 10. A further drawback to this approach is that it is difficult to set the input impedance 26 of amplifier 12 and the gain of amplifier 12 independently of each other. Instead, once the input impedance 26 of amplifier 12 is set by the added resistor, the gain is generally fixed.

Mixer 14 comprises a bolometer, photoconductor, Schottky diode, quantum nonlinear devices (e.g. SIS receivers or Josephson junction mixers), variable gain amplifier or any other suitable device that multiplies RF signal 30 with a local oscillator (LO) signal 32 to generate an intermediate frequency (IF) signal 34. In the stacked configuration, mixer 14 and amplifier 12 may share at least a portion of bias current 24.

First feedback resistor 18 has a first impedance, $Z_{F1}$, and second feedback resistor 20 has a second impedance, $Z_{F2}$. The first and second impedances of resistors 18 and 20, respectively, are used to establish the input impedance 26 of amplifier 12, $Z_{in}$, such that it substantially matches the impedance of load resistor 16, $Z_L$, without incurring the 3 dB noise problem associated with prior attempts to establish input impedance 26. Input impedance 26 is established using resistors 18 and 20 according to the following formula:

If $Z_s = Z_{in} = Z_{out} = Z_L$, then:

$$Z_{in} = \sqrt{Z_{F1} * Z_{F2}}$$

where $Z_{in}$=input impedance of amplifier 12;
$Z_{F1}$=impedance of feedback resistor 18; and
$ZF_2$=impedance of feedback resistor 20.

In general, $Z_s$ comprises the source impedance of circuit 10, such as, for example, the impedance of that circuitry seen by amplifier 12 as indicated by arrow 40. $Z_{in}$ comprises the impedance of at least a portion of circuit 10, including at least amplifier 12, as indicated by arrow 26. $Z_{out}$ comprises the impedance of at least a portion of circuit 10 as indicated by arrow 42. $Z_L$ comprises the impedance of a load, such as load resistor 16.

In a particular embodiment, the impedance of feedback resistor 20 is used to establish the gain of amplifier 12. The impedance of feedback resistor 18 is then selected according to the formula described above such that input impedance 26 matches the impedance of load resistor 16. A particular advantage of circuit 10 is that the input impedance 26 of amplifier 12 and the gain of amplifier 12 may be set independently of each other by feedback resistors 18 and 20, respectively.

Figure 2:
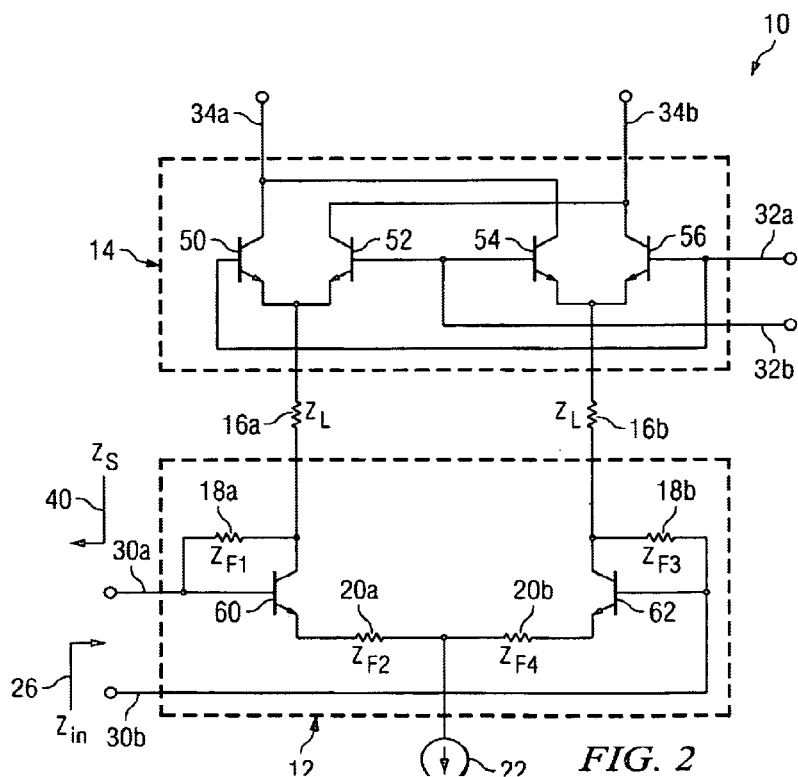
FIG. 2 illustrates a detailed view of the circuit of FIG. 1.

FIG. 2 illustrates a particular embodiment of circuit 10 showing additional details of amplifier 12 and mixer 14. This embodiment of circuit 10 further includes a current source 22. Mixer 14 includes a first transistor 50, a second transistor 52, a third transistor 54, and a fourth transistor 56. Although the description of transistors 50–56 is detailed with respect to (npn) bipolar junction transistors (BJTs), it should be understood that transistors 50–56 may comprise any suitable combination of (pnp) BJTs, field effect transistors (FETs), metal oxide semiconductor field effect transistors (MOSFETs) or any other suitable transistor. In general, first transistor 50 has a base that is coupled to voltage signal 32a, a collector terminal, and an emitter terminal that is coupled to load resistor 16a. Second transistor 52 comprises a base terminal that is coupled to voltage signal 32b that is generally one-hundred-eighty degrees out of phase with voltage signal 32a, a collector terminal, and an emitter terminal that is coupled to the emitter terminal of transistor 50 and load resistor 16a. Transistor 54 comprises a base terminal that is coupled to signal 32b and the base terminal of transistor 52, a collector terminal that is coupled to the collector terminal of transistor 50, and an emitter terminal that is coupled to load resistor 16b. Transistor 56 comprises a base terminal that is coupled to signal 32a, a collector terminal that is coupled to the collector terminal of transistor 52, and an emitter terminal that is coupled to the emitter terminal of transistor 54 and load resistor 16b.

Amplifier 12 comprises a first transistor 60 having a base terminal coupled to signal 30a, a collector terminal, and an emitter terminal. First feedback resistor 18a has a first lead that is coupled to the base terminal of transistor 60 and a second lead that is coupled to the collector terminal of transistor 60 and load resistor 16a. Second feedback resistor 20a has a first lead coupled to the emitter terminal of transistor 60 and a second lead coupled to current source 22. Amplifier 12 further comprises second transistor 62 having a base terminal coupled to signal 30b that is substantially one-hundred-eighty degrees out of phase with signal 30a, a collector terminal, and an emitter terminal. Third feedback resistor 18b has a first lead coupled to the base of transistor 62, and a second lead coupled to the collector of transistor 62. Fourth feedback resistor 20b has a first lead coupled to the emitter of transistor 62 and a second lead coupled to current source 22.

In this embodiment of circuit 10, the RF signal received by amplifier 12 comprises a differential signal formed by signals 30a and 30b where signal 30b is one-hundred-eighty degrees out of phase with signal 30a. Similarly, the local oscillator signal received by mixer 14 is also a differential signal. The local oscillator signal is formed by signal 32a and signal 32b that is substantially one-hundred-eighty degrees out of phase with signal 32a. As a result, the intermediate frequency (IF) signal generated by mixer 14 is also a differential signal, and is formed by signal 34a and signal 34b that is substantially one-hundred-eighty degrees out of phase with signal 34a.

In this embodiment of circuit 10, the input impedance 26 of amplifier 12 is determined according to the following formula:

If $Z_s = Z_{in} = Z_{out} = Z_L$, then:

$$Z_{in} = \sqrt{Z_{F1} * Z_{F2}} + \sqrt{Z_{F3} * Z_{F4}}$$

where $Z_{in}$=input impedance of amplifier 12;
$Z_{F1}$=impedance of feedback resistor 18a;
$Z_{F2}$=impedance of feedback resistor 20a;
$Z_{F3}$=impedance of feedback resistor 18b; and
$Z_{F4}$=impedance of feedback resistor 20b.

Figure 3:
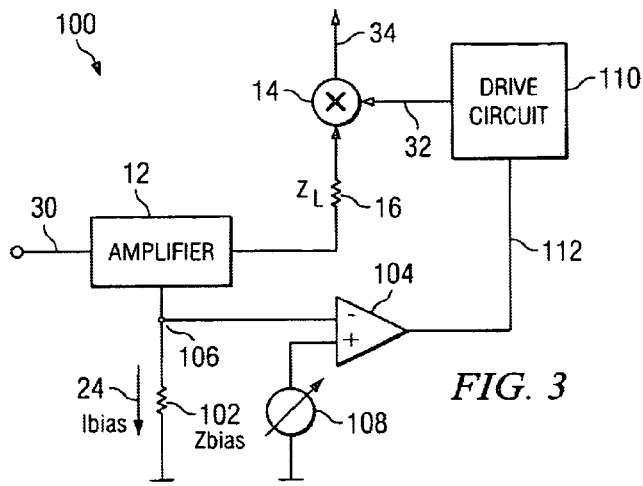
FIG. 3 illustrates one embodiment of a circuit for establishing a bias current for an amplifier and a mixer in a stacked configuration.

FIG. 3 illustrates one embodiment of a circuit 100 for establishing a bias current 24 for amplifier 12 and mixer 14 arranged in a stacked configuration. Circuit 100 comprises amplifier 12 coupled to mixer 14 using resistor 16. Circuit 100 further comprises a bias resistor 102, a comparator 104 having a first input terminal coupled to a node 106 and a second input terminal coupled to a voltage source 108. A drive circuit 110 couples comparator 104 to mixer 14. In general, comparator 104 compares a bias voltage at node 106 with a reference voltage generated by voltage source 108, and generates an output signal 112 based upon this comparison. A drive circuit 110 generates signal 32 in response to output signal 112 such that the bias voltage at node 106 approaches and subsequently equals the reference voltage generated by source 108, thereby establishing an appropriate bias current 24. The reference voltage generated by voltage source 108 is selected such that the reference voltage divided by the impedance of the bias resistor 102, $Z_{bias}$, establishes the bias current 24 at a desired level.

Comparator 104 comprises, in one embodiment, a differential operational amplifier (op-amp) having a negative input terminal coupled to node 106 and a positive input terminal coupled to voltage source 108. Although comparator 104 is illustrated as a differential op-amp, it should be understood that comparator 104 may comprise any suitable number and combination of circuit elements that may perform the comparison operation described herein to generate an appropriate output signal 112.

Drive circuit 110 comprises any suitable circuitry used to generate LO signal 32, also referred to as drive voltage 32 or a common mode voltage, in response to output signal 112 generated by comparator 104. In a particular embodiment, drive circuit 110 comprises a polyphase filter operable to generate a quadrature output.

In operation, a reference voltage is generated by voltage source 108 such that the reference voltage divided by the impedance of bias resistor 102, $Z_{bias}$, equals the bias current 24 that is desired for circuit 100. Upon powering up circuit 100, the bias current 24 is substantially zero such that the reference voltage generated by voltage source 108 is greater than the bias voltage at node 106. In this regard, the voltage of the signal applied to the positive input terminal of comparator 104 is greater than the voltage of the signal applied to the negative input terminal of comparator 104. As a result, output signal 112 causes drive circuit 110 to increase the voltage of signal 32. In response, mixer 14 starts to draw a current through bias resistor 102 thereby establishing a bias voltage at node 106. The voltage of signal 32 continues to increase, and therefore the bias voltage at node 106 continues to increase, until the bias voltage at node 106 reaches the reference voltage generated by voltage source 108.

If the voltage of signal 32 increases too much such that mixer 14 draws excessive current and causes the bias voltage at node 106 to be greater than the reference voltage generated by source 108, then comparator 104 generates an output signal 112 that causes drive circuit 110 to decrease the voltage of signal 32. Circuit 100 operates in this transient state until eventually circuit 100 reaches a steady-state operation during which time the bias voltage at node 106 equals the reference voltage generated by source 108. In this regard, the feedback loop formed by comparator 104 and drive circuit 110 may establish an appropriate bias current 24. At least a portion of bias current 24 is shared by amplifier 12 and mixer 14 which are arranged in a stacked configuration as illustrated in FIG. 3. A particular advantage of this configuration and technique for establishing bias current 24 is that the current source 22 illustrated in FIGS. 1 and 2 that is otherwise used to generate bias current 24 is no longer needed. As a result, the voltage headroom associated with operating the transistor of the current source is saved. This may amount to a savings of 1.0 to 1.5 volts of headroom.

Figure 4A:
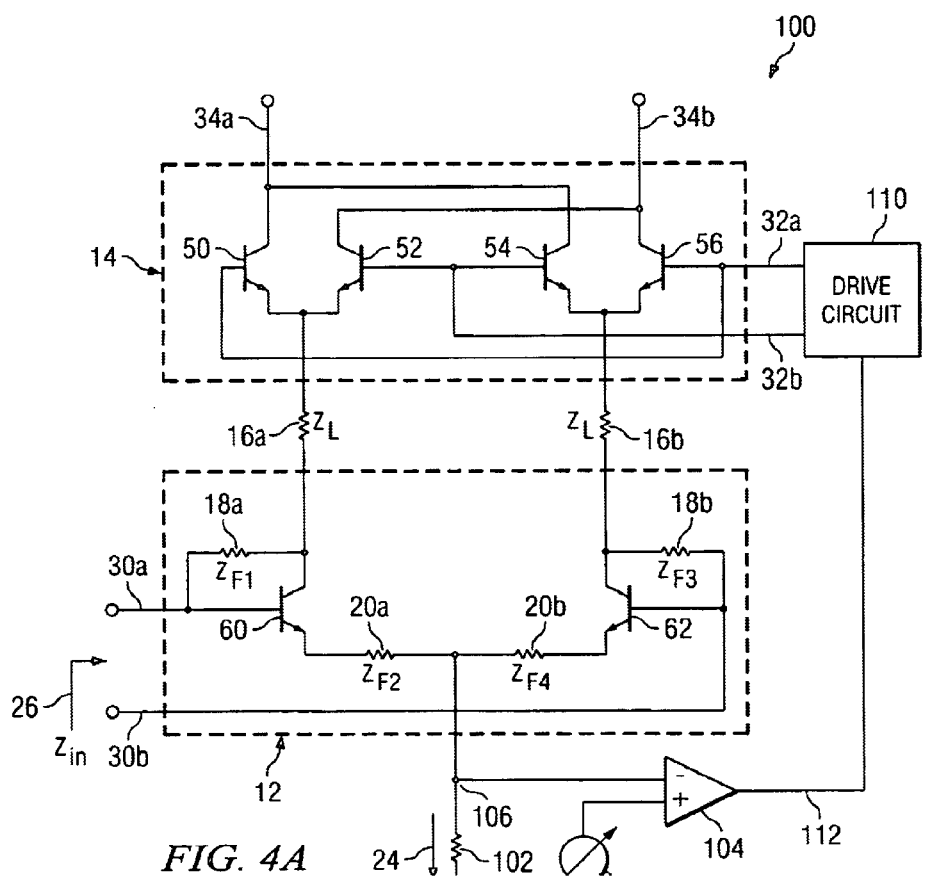
FIGS. 4A, 4B, and 4C illustrate detailed views of the circuit of FIG. 3.
Figure 4B:
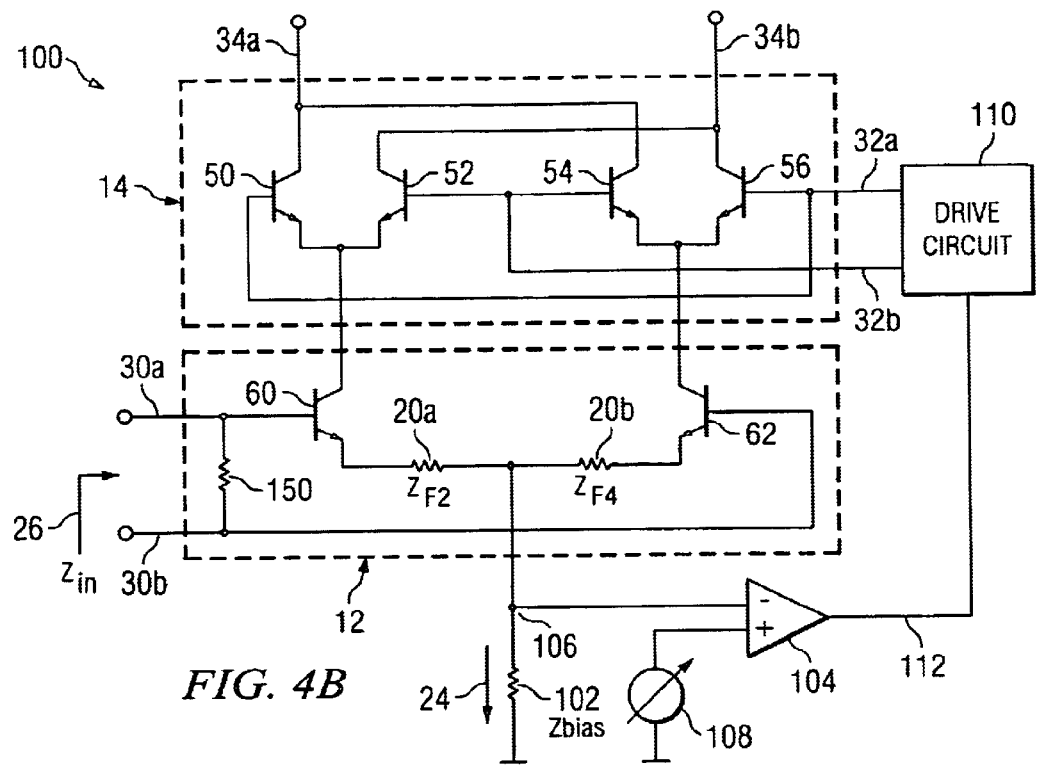
Figure 4C:
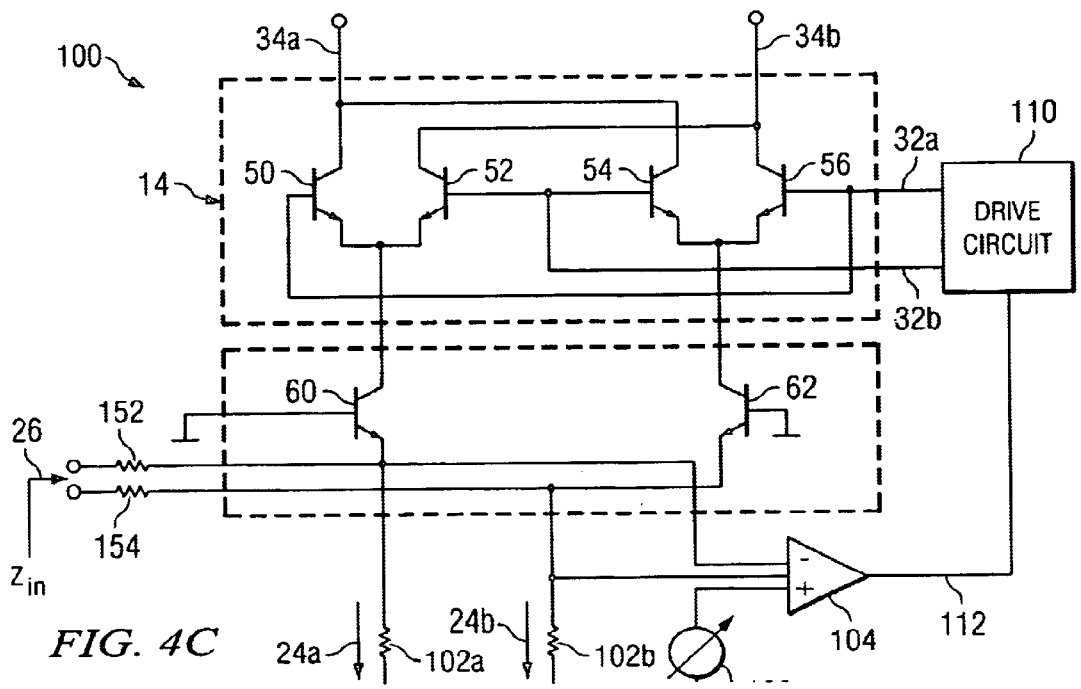

FIGS. 4A, 4B, and 4C illustrate various embodiments of circuit 100 that receive differential input signals and generates differential output signals.

FIG. 4A illustrates circuit 100 using first feedback resistors 18a and 18b and second feedback resistors 20a and 20b, to establish the input impedance 26 of amplifier 12 such that it substantially matches the impedance associated with load resistors 16a and/or 16b, as described above with reference to FIGS. 1 and 2. FIG. 4B illustrates circuit 100 using a shunt resistor 150 to match input impedance 26 of amplifier 12 to the impedance associated with load resistors 16a and/or 16b. FIG. 4C illustrates circuit 100 using series resistors 152 and 154 to match input impedance 26 of amplifier 12 to the impedance associated with load resistors 16a and/or 16b. FIGS. 4A, 4B, and 4C further illustrate the use of comparator 104 and drive circuit 110 in a feedback loop to establish bias current 24, as described above with reference to FIG. 3. In this regard, the comparator 104 illustrated in FIG. 4C compares either the voltage at the emitter of transistor 60 or the voltage at the emitter of transistor 62 with the reference voltage generated by voltage source 108. In a particular embodiment, comparator 104 of FIG. 4C compares the average of the voltages at the emitter of transistor 60 and at the emitter of transistor 62 with the reference voltage generated by voltage source 108.

Although the present invention has been described in detail, it should be understood that various changes, substitutions and alterations can be made hereto without departing from the sphere and scope of the invention as defined by the appended claims.

To aid the Patent Office, and any readers of any patent issued on this application in interpreting the claims appended hereto, applicants wish to note that they do not intend any of the appended claims to invoke ¶ 6 of 35U.S.C. § 112 as it exists on the date of filing hereof unless "means for" or "step for" are used in the particular claim.

What is claimed is:

1. A circuit for establishing the input impedance of an amplifier, comprising:
   an amplifier having an input impedance and coupled to a load having a load impedance;
   a circuit component coupled to the load and operable to share at least a portion of a bias current with the amplifier;
   a first feedback resistor coupled to the amplifier and the load, the first feedback resistor having a first impedance; and
   a second feedback resistor coupled to the amplifier, the second feedback resistor having a second impedance;
   wherein the input impedance of the amplifier is established based at least in part upon the first impedance and the second impedance.

2. The circuit of claim 1, wherein:
   the second impedance is selected to establish a gain of the amplifier; and
   the first impedance is selected to establish the input impedance, based at least in part upon the second impedance.

3. The circuit of claim 1, wherein the second feedback resistor couples the amplifier to a current source that generates the bias current.

4. The circuit of claim 3, wherein:
   the amplifier comprises a transistor having a first terminal, a second terminal, and a third terminal;
   the first feedback resistor has a first lead coupled to the first terminal and a second lead coupled to the load and the second terminal; and
   the second feedback resistor has a first lead coupled to the third terminal and a second lead coupled to the current source.

5. The circuit of claim 1, wherein the input impedance is established such that the input impedance substantially matches the load impedance.

6. The circuit of claim 1, wherein the input impedance comprises the square root of the product formed by the first impedance and the second impedance.

7. The circuit of claim 1, wherein the amplifier comprises a first amplifier and the circuit component comprises a second amplifier.

8. The circuit of claim 1, wherein:
   the amplifier communicates an RF signal; and the circuit component comprises a mixer that generates an intermediate frequency signal based at least in part upon the RF signal and a local oscillator signal.

9. The circuit of claim 8, wherein the RF signal comprises a differential signal and the intermediate frequency signal comprises a differential signal.

10. A circuit for establishing the input impedance of an amplifier, comprising:
a circuit component coupled to a load having a load impedance;
an amplifier coupled to the load and having an input impedance, the amplifier comprising a transistor having a first terminal, a second terminal, and a third terminal;
a first feedback resistor having a first lead coupled to the first terminal and a second lead coupled to the load and the second terminal, the first feedback resistor associated with a first impedance; and
a second feedback resistor having a first lead coupled to the third terminal, the second feedback resistor associated with a second impedance;
wherein the input impedance of the amplifier is established based at least in part upon the first impedance and the second impedance such that the input impedance substantially matches the load impedance.

11. The circuit of claim 10, wherein:
the second impedance is selected to establish a gain of the amplifier; and
the first impedance is selected to establish the input impedance, based at least in part upon the second impedance.

12. The circuit of claim 10, wherein the second resistor has a second lead coupled to a current source and the circuit component is operable to share at least a portion of a bias current with the amplifier, the bias current generated by the current source.

13. The circuit of claim 10, wherein:
the transistor comprises a bipolar junction transistor having a base, an emitter, and a collector;
the first terminal comprises the base;
the second terminal comprises the collector; and
the third terminal comprises the emitter.

14. The circuit of claim 10, wherein the input impedance comprises the square root of the product formed by the first impedance and the second impedance.

15. The circuit of claim 10, wherein the amplifier comprises a first amplifier and the circuit component comprises a second amplifier.

16. The circuit of claim 10, wherein:
the amplifier communicates an RF signal; and
the circuit component comprises a mixer that generates an intermediate frequency signal based at least in part upon the RF signal and a local oscillator signal.

17. The circuit of claim 16, wherein the RF signal comprises a differential signal and the intermediate frequency signal comprises a differential signal.

18. A circuit for establishing the input impedance of an amplifier, comprising:
a mixer comprising:
a first transistor having a first terminal coupled to a first voltage signal, a second terminal, and a third terminal;
a second transistor having a first terminal coupled to a second voltage signal one-hundred-eighty degrees out of phase with the first voltage signal, a second terminal, and a third terminal coupled to the third terminal of the first transistor and further coupled to a first load resistor;
a third transistor having a first terminal coupled to the first terminal of the second transistor and the second voltage signal, a second terminal coupled to the second terminal of the first transistor, and a third terminal; and
a fourth transistor having a first terminal coupled to the first terminal of the first transistor and the first voltage signal, a second terminal coupled to the second terminal of the second transistor, and a third terminal coupled to the third terminal of the third transistor and further coupled to a second load resistor; and
an amplifier having an input impedance, the amplifier comprising:
a fifth transistor having a first terminal, a second terminal, and a third terminal;
a first feedback resistor having a first lead and a second lead, the first lead coupled to the first terminal of the fifth transistor and the second lead coupled to the first load resistor and the second terminal of the fifth transistor, wherein the first feedback resistor is associated with a first impedance;
a second feedback resistor having a first lead and a second lead, the first lead coupled to the third terminal of the fifth transistor and the second lead coupled to a current source, wherein the second feedback resistor is associated with a second impedance;
a sixth transistor having a first terminal, a second terminal, and a third terminal;
a third feedback resistor having a first lead and a second lead, the first lead coupled to the first terminal of the sixth transistor and the second lead coupled to the second load resistor and the second terminal of the sixth transistor, wherein the third feedback resistor is associated with a third impedance; and
a fourth feedback resistor having a first lead and a second lead, the first lead coupled to the third terminal of the sixth transistor and the second lead coupled to the current source, wherein the fourth feedback resistor is associated with a fourth impedance;
wherein the input impedance of the amplifier is established based at least in part upon the first impedance, the second impedance, the third impedance, and the fourth impedance.

19. The circuit of claim 18, wherein:
the second impedance is selected to establish a gain of the amplifier; and
the first impedance is selected to establish the input impedance, based at least in part upon the second impedance.

20. The circuit of claim 18, wherein the mixer shares at least a portion of a bias current with the amplifier, wherein the bias current is generated by the current source.

21. The circuit of claim 18, wherein the input impedance comprises the square root of the product formed by the first impedance and the second impedance plus the square root of the product formed by the third impedance and the fourth impedance.

22. The circuit of claim 18, wherein a gain of the amplifier and the input impedance are set independently of each other by the first feedback resistor, the second feedback resistor, the third feedback resistor, and the fourth feedback resistor.

23. The circuit of claim 18, wherein the first voltage signal and the second voltage signal form a local oscillator signal.

24. The circuit of claim 23, wherein:
- the amplifier communicates an RF signal; and
- the mixer generates an intermediate frequency signal based at least in part upon the RF signal and the local oscillator signal.

25. The circuit of claim 23, wherein the RF signal comprises a differential signal and the intermediate frequency signal comprises a differential signal.

26. The circuit of claim 21, wherein the input impedance substantially matches a load impedance associated with at least one of the first load resistor and the second load resistor.

* * * * *